US010852377B2

(12) United States Patent
Campagna

(10) Patent No.: US 10,852,377 B2
(45) Date of Patent: Dec. 1, 2020

(54) CONTROL APPARATUS FOR A MAGNETIC RESONANCE DEVICE

(71) Applicant: Siemens Healthcare GmbH, Erlangen (DE)

(72) Inventor: Swen Campagna, Engelthal (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 112 days.

(21) Appl. No.: 16/131,083

(22) Filed: Sep. 14, 2018

(65) Prior Publication Data

US 2019/0086495 A1 Mar. 21, 2019

(51) Int. Cl.
*G01R 33/48* (2006.01)
*G01R 33/54* (2006.01)
*G01R 33/28* (2006.01)

(52) U.S. Cl.
CPC ........... *G01R 33/543* (2013.01); *G01R 33/28* (2013.01); *G01R 33/546* (2013.01)

(58) Field of Classification Search
CPC .............. G01R 33/543; G01R 33/5608; G01R 33/5611; G01R 33/5617; G01R 33/583; A61B 5/055; A61B 5/0555
See application file for complete search history.

(56) References Cited

U.S. PATENT DOCUMENTS

| 6,339,717 B1 | 1/2002 | Baumgartl et al. |
| 2006/0020612 A1* | 1/2006 | Kasai ..................... G01R 33/28 |

(Continued)

FOREIGN PATENT DOCUMENTS

| DE | 19911988 A1 | 9/2009 |
| DE | 102015213269 A1 | 1/2017 |
| DE | 202017004034 U1 | 8/2017 |

OTHER PUBLICATIONS

Li Limin et al: "Design of an MR image processing module on an FPGA chip"; Journal of Magnetic Resonance, Bd. 255, Mar. 23, 2015 (Mar. 23, 2015), pp. 51-58, XP029236987, ISSN: 1088-7887, DOI: 10.1016/J.JMR.2015.03.007; 2015.

(Continued)

*Primary Examiner* — Alesa Allgood
(74) *Attorney, Agent, or Firm* — Harness, Dickey & Pierce, P.L.C.

(57) ABSTRACT

A control apparatus for a magnetic resonance device, a system, a control system and a magnetic resonance system are disclosed. The control apparatus includes a control module, including a central coordination component, embodied to receive sequence commands calculated according to a scan sequence; a radio-frequency-control component, embodied to actuate a radio-frequency transmission unit of the magnetic resonance device in accordance with the sequence commands; and a gradient-coil-control component, embodied to actuate a gradient-coil unit of the magnetic resonance device in accordance with the sequence commands. The control apparatus further includes a peripheral module, embodied to actuate peripheral devices of the magnetic resonance device, the control module and the peripheral module meeting real-time requirements; a receiver-module port, embodied for connection of a receiver module; and a motherboard unit, the control module, the peripheral module and the receiver-module port being integrated in the motherboard unit.

25 Claims, 6 Drawing Sheets

(56) References Cited

U.S. PATENT DOCUMENTS

| | | | |
|---|---|---|---|
| 2010/0188208 A1* | 7/2010 | Fisher | G01R 33/28 340/539.12 |
| 2013/0334989 A1* | 12/2013 | Kataoka | H02N 2/0075 318/116 |
| 2014/0239949 A1* | 8/2014 | Huang | G01R 33/543 324/307 |
| 2016/0154079 A1* | 6/2016 | Jellus | G01R 33/5611 324/309 |
| 2017/0016970 A1 | 1/2017 | Campagna | |

OTHER PUBLICATIONS

European Search Report for European Patent Application No. 17191928.5 dated Mar. 20, 2018.

\* cited by examiner

CONTROL APPARATUS FOR A MAGNETIC RESONANCE DEVICE

PRIORITY STATEMENT

The present application hereby claims priority under 35 U.S.C. § 119 to European patent application number EP17191928.5 filed Sep. 19, 2017, the entire contents of which are hereby incorporated herein by reference.

FIELD

Embodiments of the invention generally relate to a control apparatus for a magnetic resonance device, a system, a control system and a magnetic resonance system.

BACKGROUND

Magnetic resonance imaging is a widely used method of medical imaging. Typically, a magnetic resonance system comprising a magnetic resonance device and a control system is used for magnetic resonance imaging. The control system usually comprises a control apparatus, in particular a control module, a peripheral module and a receiver module. The control module typically comprises components for controlling the magnetic resonance device and the receiver module is embodied to acquire radio-frequency magnetic resonance signals. Depending upon the design of the magnetic resonance system, the control system is typically arranged in an equipment room.

Implementation of the control system in a production process is a complex task. The basic architecture of the control system can have various types of construction. Herein, nowadays, it is usual to implement control systems in a manner dedicated and specific to magnetic resonance devices in accordance with the requirements of a magnetic resonance device or a product line, although many magnetic resonance devices have similar design features. Different specific implementations of control systems generally vary greatly in terms of their architecture thus resulting in low reusability and correspondingly higher development costs for multiple different control systems. For example, control systems developed for inexpensive magnetic resonance devices are frequently provided with a limited number of receive channels.

DE 10 2015 213 269 A1 discloses a modular system for fabricating a control computer comprising a real-time unit implemented as hardware for a magnetic resonance device from a group of possible different magnetic resonance devices having different design features.

SUMMARY

At least one embodiment of the invention is directed to disclosing a place-saving and expandable control apparatus for a magnetic resonance device, an enhanced control system and a magnetic resonance system with an increased degree of reusability.

Advantageous embodiments are described in the claims.

The control apparatus according to at least one embodiment of the invention for a magnetic resonance device comprises
  a control module;
  a peripheral module;
  a receiver-module port; and
  a motherboard unit,
wherein the control module comprises
  a central coordination component, which is embodied to receive sequence commands calculated according to a scan sequence,
  a radio-frequency-control component, which is embodied to actuate a radio-frequency transmission unit of the magnetic resonance device in accordance with the sequence commands and
  a gradient-coil-control component, which is embodied to actuate a gradient-coil unit of the magnetic resonance device in accordance with the sequence commands,
wherein the peripheral module is embodied to actuate peripheral devices of the magnetic resonance device,
wherein the control module and the peripheral module meet real-time requirements,
wherein the receiver-module port is embodied for the connection of a receiver module, and
wherein the control module, the peripheral module and the receiver-module port are integrated in the motherboard unit.

The system according to at least one embodiment of the invention comprises the control apparatus and the receiver module, wherein the receiving-coil unit of the magnetic resonance device comprises the receive channel and wherein the receiver module is connected to the motherboard unit by way of the receiver-module port and is embodied to acquire radio-frequency magnetic resonance signals received via the receive channel of the receiving-coil unit of the magnetic resonance device. In other words, the control apparatus is expanded or supplemented by the receiver module on the receiver-module port.

The control system according to at least one embodiment of the invention comprises
  an interface,
  a personal computer and
  the control apparatus,
wherein the personal computer meets softer real-time requirements than the control module and the peripheral module,
wherein the personal computer is embodied to calculate the sequence commands in accordance with the scan sequence and comprises a housing,
wherein the interface is wired and embodied to transmit the sequence commands from the personal computer to the central coordination component and
wherein the control apparatus is connected to the personal computer via the interface and arranged outside the housing of the personal computer.

A magnetic resonance system according to at least one embodiment of the invention comprises
  the control system and
  the magnetic resonance device,
wherein the magnetic resonance device comprises the radio-frequency transmission unit, the gradient-coil unit, the peripheral devices and the receiving-coil unit.

BRIEF DESCRIPTION OF THE DRAWINGS

The following describes and explains the invention in more detail with reference to the example embodiments depicted in the figures, in which.

DETAILED DESCRIPTION OF THE EXAMPLE EMBODIMENTS

Figure 1:
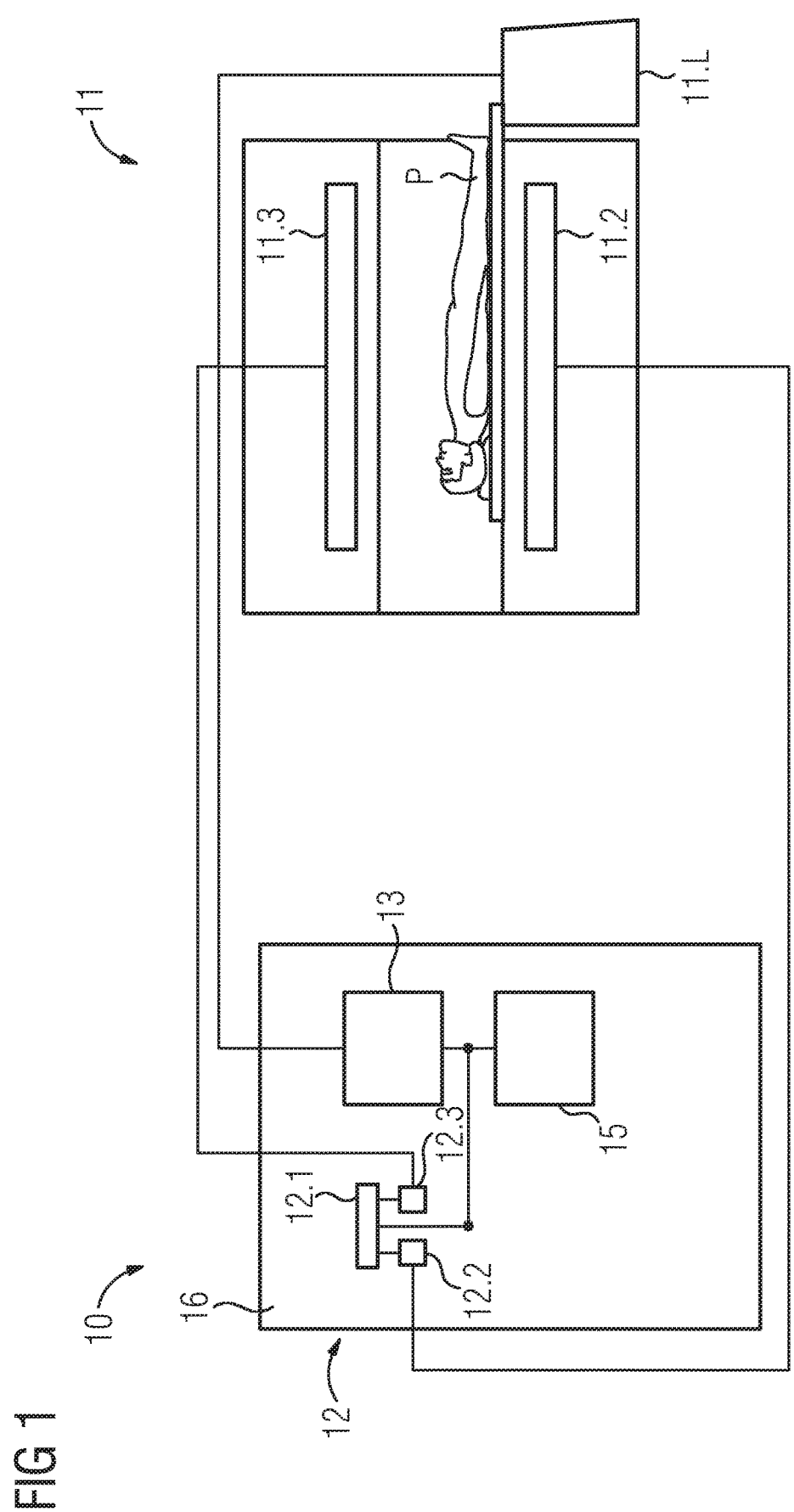
FIG. 1 shows a control apparatus in a first example embodiment.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

The control apparatus according to at least one embodiment of the invention for a magnetic resonance device comprises
    a control module;
    a peripheral module;
    a receiver-module port; and
    a motherboard unit,
wherein the control module comprises
    a central coordination component, which is embodied to receive sequence commands calculated according to a scan sequence,
    a radio-frequency-control component, which is embodied to actuate a radio-frequency transmission unit of the magnetic resonance device in accordance with the sequence commands and
    a gradient-coil-control component, which is embodied to actuate a gradient-coil unit of the magnetic resonance device in accordance with the sequence commands,
wherein the peripheral module is embodied to actuate peripheral devices of the magnetic resonance device,
wherein the control module and the peripheral module meet real-time requirements,
wherein the receiver-module port is embodied for the connection of a receiver module, and
wherein the control module, the peripheral module and the receiver-module port are integrated in the motherboard unit.

The control apparatus can enable the integration of a basic set of functionalities, which are used to control a magnetic resonance device across multiple product lines. Such integration preferably ensures a high degree of reusability and a space-saving design, wherein the control apparatus is simultaneously expandable in accordance with the embodiment of the magnetic resonance device. A further technical effect is in particular the fact that, due to the integration of the control module and the peripheral module in the motherboard unit, it is preferably possible for a logic module to be optimally utilized and efficiently operated, in particular if, for example, in particular a logic circuit of the control module and the peripheral module are jointly mapped in the logic module. The respective logic circuit in particular corresponds to a respective logical part of the control module and/or the peripheral module. In addition, in particular there is a reduced requirement for technical, and hence often expensive cabling for connecting the control module, the peripheral module and/or the receiver-module port to each other in each case. The high degree of reusability has a positive impact in the form of reduced costs for the control apparatus due to higher quantities, for example.

Real-time requirements require the respective module or the respective component in particular to provide timely output and/or timely transmission of a calculated value and/or a control signal in a defined period of time. Accordingly, the fulfillment of real-time requirements by the respective module in particular means that the respective module is able to perform the timely output of the calculated value and/or control signal in the defined period of time after receiving an input signal. In this case, the respective module is typically described as having real-time capability. If, for example, the defined period of time is less than 10 ns, these real-time requirements are in particular described as hard and/or cycle-accurate. It is particularly advantageous if the defined period of time is less than 0.01 ns. The peripheral module can meet harder real-time requirements than the control module and vice versa. Soft real-time requirements, on the other hand, usually require timely output after a comparatively longer period of time.

Alternatively or additionally, the real-time requirements can necessitate immediate output of the control signal, for example. In this context, reference is in particular made to immediate-time requirements and/or particularly hard real-time requirements. Preferably, immediate-time requirements go beyond particularly hard, in particular ultra-short, real-time requirements insofar as an immediate-time component that meets the immediate-time requirements in particular has no awareness of or control over the time, but carries out commands immediately and switches signals. In this case, it is possible for latency of the immediate-time component to be measured and, for example, compensated in the logic circuit of the control module. Preferably, jitter of the immediate-time component is low.

The control module and the peripheral module typically each comprise a physical part and a logical part. The logical part in particular corresponds to the respective logic circuit. The respective logic circuit is preferably embodied to control the respective physical part. The physical part can, for example, comprise lines, switches, connectivity, microcontrollers and/or ports. Usually, logical parts are more likely to meet soft or hard real-time requirements, while the physical parts are more likely to be able to meet immediate-time requirements. For example, it is conceivable that the logical part meets hard real-time requirements while simultaneously the physical part meets immediate-time requirements. In this case, the logical part is in particular located in a different temporal domain than the physical part. If the different temporal domains are linked, time harmonization or synchronization may be required.

It is generally the case that, depending on the defined period of time or the temporal domain, software and/or pure hardware meet real-time requirements, in particular immediate-time requirements. For soft real-time requirements, it is frequently possible to use standard systems, for example a commercially available personal computer with a commercially available computing unit and storage unit. A standard system of this kind comprises, for example, a Microsoft Windows operating system or a Linux operating system, usually supplemented by software real-time extensions. Software real-time extensions typically have real-time capability and in particular meet soft real-time requirements. Software/hardware interaction can require specially adapted drivers. Hard real-time requirements in particular require special hardware architectures and/or corresponding software programs and operating systems. One possible example of special hardware architecture is a logic module. Usually, the outlay for setting up and operating such hardware and software is more expensive compared to commercially available goods. For example, in each case, the logical part of the control module and/or the peripheral module can be mapped in the individual logic module. In other words, the logic module comprises the logical part.

The control module and the peripheral module meet real-time requirements in particular for precisely-timed actuation of the corresponding units of the magnetic resonance device. It is in principle conceivable, for example, that the control module meets hard real-time requirements, and the peripheral module meets particularly hard real-time requirements or immediate-time requirements.

Typically, the control module, in particular the radio-frequency-control component and the gradient-coil-control component, emits control signals to the radio-frequency transmission unit and gradient-coil unit of the magnetic resonance device to be actuated. Normally, the control module, in particular the radio-frequency-control component and the gradient-coil-control component, can actuate the radio-frequency transmission unit or the gradient-coil unit in a precisely-timed, coordinated and cycle-accurate manner with the control signals in accordance with the sequence commands. The control signals can in particular be digital. It is possible in each case for a digital-analog converter and a radio-frequency amplifier or a gradient-coil amplifier to be set up between the radio-frequency-control component and the radio-frequency control unit and between the gradient-coil-control component and the gradient-coil unit, wherein the digital-analog converter is typically not a component of the control apparatus. The radio-frequency amplifier and the gradient-coil amplifier can preferably be used to amplify the respective control signals. In this case, the control signals in particular correspond to coil current waveforms. The control module can additionally comprise a shim coil control component, which is embodied to actuate a shim coil unit of the magnetic resonance device in accordance with the sequence commands.

The central coordination component is in particular connected to the radio-frequency-control component and the gradient-coil-control component via a signal line. The central coordination component can preferably be connected to the peripheral module.

The scan sequence is usually specified by a user and in particular includes parameterization of a scan from an imaging examination of a patient. The scan sequence can also comprise the parameterization of a plurality of scans, for example a localizer, a T1 scan and a T2 scan. The localizer is usually used to acquire topograms. The T1 scan or T2 scan can be parameterized differently according to the application. Further scan types and repetitions of scans are conceivable. The scan sequence can in particular correspond to a temporal course of the scan, wherein the temporal course can in particular be specified by the user.

The sequence commands should in particular be understood to be instructions to the control module for the actuation of the magnetic resonance device in accordance with the scan sequence. Therefore, the sequence commands in particular include the temporal coordination of a sequence of radio-frequency pulses and gradient fields. The central coordination component preferably carries out the temporal coordination and initiates the emission of the radio-frequency pulses and the gradient fields in accordance with the specified sequence in the respective component. The sequence of the radio-frequency pulses and gradient fields is in particular characteristic of the scan sequence.

In particular, the control signals comprise the radio-frequency pulses and/or the gradient fields. The radio-frequency pulses are, for example, set by the radio-frequency-control component in accordance with the sequence commands and emitted by the radio-frequency transmission unit in the magnetic resonance device. A frequency of the radio-frequency pulse is in particular in the radio-frequency range. The gradient fields are usually set by the gradient-coil-control component in accordance with the sequence commands and generated via the gradient-coil unit in the magnetic resonance device. The gradient fields are typically magnetic fields and are used to vary the main magnetic field of the magnetic resonance device. The main magnetic field is usually generated by a main-magnetic-field unit of the magnetic resonance device.

The peripheral module is connected to the control module, in particular the central coordination component. The peripheral module is, for example, connected to the control module via an optical waveguide for the peripheral module and/or a further signal line. The peripheral devices are usually decentralized units of the magnetic resonance device, which, for example, are not permanently installed and/or not required for every imaging examination. The peripheral devices of the magnetic resonance devices comprise, for example, a patient bench, a communication device for the patient, an ECG scanner (ECG=echocardiogram), a door contact for an examination room in which the magnetic resonance device is arranged, a temperature detection system, a ventilation system and a light for the patient or the like. Depending upon the embodiment of the magnetic resonance device, the peripheral devices can comprise a shim device.

The peripheral devices can have different real-time requirements in each case and are in particular connected to the peripheral module. For example, the peripheral module can receive ECG signals from the connected ECG scanner and transmit them to the control module. Preferably, the control module can adapt the sequence commands to the ECG signals. This is advantageous if, for example, a scan in the magnetic resonance device acquires a thorax of the patient because the thorax usually moves as a function of the patient's cardiac rhythm and this movement can induce image artifacts. The ECG signals can preferably ascertain the cardiac rhythm and the sequence commands can be adapted to the cardiac rhythm in accordance with the ECG signals and hence image artifacts can be avoided, at least partially. In contrast to positioning of the patient bench, which usually takes place in accordance with immediate-time requirements, the peripheral module meets soft real-time requirements in particular for the transmission of the ECG signals. The control module can, for example, transmit breathing instructions to the communication device in accordance with the sequence commands and emit them via the communication device.

Depending upon the imaging examination, a receiving-coil unit of the magnetic resonance device can be varied and typically exchanged by the user in situ. For example, a head coil has different design than that of an abdomen coil, wherein preferably a head of the patient can be acquired via the head coil and optimally an abdomen of the patient can be acquired via the abdomen coil. The receiving-coil unit typically comprises a varying number of coil elements, wherein typically a separate receive channel is provided for each coil element. In principle, the image quality, and hence also the acquisition costs of the receiving-coil unit, correlates with the number of receive channels.

The receiver module, in particular the physical part of the receiver module can preferably be connected to the receive channel of the receiving-coil unit of the magnetic resonance device via a transmission channel. Depending upon the design of the receiving-coil unit, the receive channel can correspond to the physical-coil element or only to one connecting line to the physical-coil element. In any case, the receive channel is embodied to transmit the received radio-frequency magnetic resonance signals. The receiver module usually acquires a continuous stream of radio-frequency magnetic resonance signals.

Usually, an analog-to-digital converter is set up between the receiver module and the receiving-coil unit. The analog-to-digital converter is preferably not a component of the control apparatus. the control apparatus substantially operates with digital signals.

Advantageously, the receiver module can be connected to the control module such that in particular the central coordination component is able to specify a read-out time to the receiver module for time-harmonized reception of the radio-frequency magnetic resonance signals in accordance with the sequence commands. Alternatively or additionally, the receiver module is embodied for data reduction of the radio-frequency magnetic resonance signals and/or preprocessing. Transmission of the radio-frequency magnetic resonance signals in particular takes place in a data stream from the magnetic resonance device to the control apparatus. This transmission in particular takes place without reference to the time, i.e. in particular in accordance with immediate-time requirements.

The receiver-module port can, for example, be embodied as a plug-in card port for a plug-in card. The plug-in card is in this case preferably embodied as the receiver module. The plug-in card port and the plug-in card can in particular conform to the "Peripheral Component Interconnect Express" PCIe standard or another comparable standard. In principle, it is conceivable that the plug-in card port and the plug-in card conform to a standard developed individually by a manufacturer of the control apparatus.

Alternatively, the receiver-module port can be embodied as optical waveguide port for an optical waveguide of the plug-in card. In this case, the optical waveguide port can be connected to the optical waveguide of the plug-in card. Further wired connections between the plug-in card and the receiver-module port are also conceivable. In principle, it is possible for the control apparatus to comprise a further receiver-module port which is, example, embodied differently from the receiver-module port. For example, it is conceivable that the receiver-module port comprises the plug-in card port and the further receiver-module port comprises a wired port.

The motherboard unit in particular comprises at least one printed circuit board, wherein the at least one printed circuit board electrically connects the control module, the peripheral module and the receiver-module port. The control module, the peripheral module and the receiver-module port are in particular mechanically attached to the at least one printed circuit board and, for example, connected via conductor tracks of the at least one printed circuit board. Alternatively or additionally to the conductor tracks, further signal lines are conceivable, which are not integrated in the at least one printed circuit board. For example, the control module and the peripheral module can be connected via the optical waveguide for the peripheral module.

Depending upon the embodiment, the control module, the peripheral module and the receiver-module port can be loosely or firmly integrated in the motherboard unit. Loose integration in particular only corresponds to a typical wired connection from the control module, the peripheral module and the receiver-module port, which are each embodied on a separate printed circuit board or a separate hardware assembly. Firm integration can mean that the control module, the peripheral module and the receiver-module port are arranged together on a single printed circuit board and, to be precise, on the at least one printed circuit board. Mixed forms between loose and firm integration, with which with which in each case different modules are combined and electrically connected are conceivable. The control module, the peripheral module and the receiver-module port in particular form the motherboard unit and hence preferably a physically coherent or enclosed unit. The wired connection can, for example, be embodied to transmit power, control signals, sequence commands and/or the radio-frequency magnetic resonance signals.

One embodiment provides that the control apparatus comprises a time-harmonization component and that the time-harmonization component is integrated in the motherboard unit and is embodied to output a timing signal and to harmonize the time of the control module, the peripheral module and the receiver-module port by way of the timing signal. The timing signal is in particular a binary signal. The time harmonization typically corresponds to temporal synchronization of the control module and the peripheral module. Usually, the time-harmonization component makes it easier to meet real-time requirements. The time-harmonization component is preferably connected to the control module, the peripheral module, in particular to the respective logical part thereof, and the receiver-module port. When the receiver module is connected to the receiver-module port, the time-harmonization component can preferably synchronize the receiver module by way of the timing signal. The central coordination component can preferably use the timing signal to specify and monitor the sequence of the radio-frequency pulses and the gradient fields and the read-out period.

One embodiment provides that the control apparatus comprises an FPGA, wherein the FPGA is embodied as a single hardware assembly and that the control module and/or the peripheral module are mapped in the FPGA. The hardware assembly is preferably produced in pieces and in particular forms a coherent unit, which is, for example, enclosed in a hardware housing. The FPGA is typically called an integrated circuit, which can be configured in accordance with a predetermined logic circuit or program code segments. The FPGA (field programmable gate array) preferably meets real-time requirements, can correspond to the logic module and/or be connected to the time-harmonization component to receive the timing signal. Advantageously, the logic circuit, in particular the logical part, of the peripheral module and the control module is wholly, or at least partially, mapped in the FPGA. Alternatively, only the logical part of either the peripheral module or the control module is mapped in the FPGA.

One embodiment provides that the control apparatus comprises an integrated receiver module and that the integrated receiver module is embodied to acquire radio-frequency magnetic resonance signals received via the receive channel of the receiving-coil unit of the magnetic resonance device, meets real-time requirements and is integrated in the motherboard unit. The integrated receiver module can substantially correspond to the receiver module, which can be connected to the receiver-module port. Any difference will usually be a structural design. The integrated receiver module is preferably permanently integrated in the motherboard unit, while the receiver module is, for example, integrated in the plug-in card, wherein the plug-in card is in particular connected detachably to the control apparatus via the receiver-module port.

One embodiment provides that the integrated receiver module is mapped in the FPGA and the FPGA is embodied to filter the radio-frequency magnetic resonance signals. The mapping of the integrated receiver module, in particular a logic circuit of the integrated receiver module in the FPGA, in which, for example, the respective logical part of the control module and/or the peripheral module is already mapped, is in particular advantageous in respect of optimal utilization of the FPGA and can additionally enable simpler communication between the integrated receiver module, the control module and the peripheral module. In principle, it is conceivable that the control apparatus comprises a further FPGA, in which for example the logic circuit of the integrated receiver module is mapped and only the respective logical part of the control module and/or the peripheral module are mapped in the FPGA. However, in a particularly preferred embodiment, the logic circuit of the control module, the peripheral module and the integrated receiver module is mapped in a single FPGA.

The filtering of the radio-frequency magnetic resonance signals can in particular include reduction, algorithmic pre-processing and/or frequency modulation of the radio-frequency magnetic resonance signals. The filtering can in particular correspond to reading out the radio-frequency magnetic resonance signals in accordance with the read-out period. The reading out can, for example, mean punching out the radio-frequency magnetic resonance signals and hence the separation of radio-frequency magnetic resonance signals into those that are relevant or those that are irrelevant for image reconstruction. FPGAs are usually used to pre-process and/or filter the radio-frequency magnetic resonance signals efficiently and quickly.

One embodiment provides that the integrated receiver module comprises an optical waveguide port, wherein the optical waveguide port is embodied to connect the receive channel of the receiving-coil unit of the magnetic resonance device and to transmit the radio-frequency magnetic resonance signals from the receive channel of the receiving-coil unit to the receiver module. Typically, an optical waveguide for the integrated receiver module is connected to the optical waveguide port and to the receive channel of the receiving-coil unit. In particular, the physical part of the integrated receiver module can correspond to the optical waveguide port. In this case, the optical waveguide for the integrated receiver module is embodied as the transmission channel between the integrated receiver module and the receive channel of the receiving-coil unit and to transmit the radio-frequency magnetic resonance signals.

In addition to optical conductors, for example electric conductors or other conductors known to the person skilled in the art are also conceivable. If the integrated receiver module comprises the optical waveguide port and the FPGA, the logic circuit of the integrated receiver module is preferably mapped in the FPGA and the physical part of the integrated receiver module, such as, for example, the optical waveguide port, can be connected outside the FPGA. The optical waveguide for the integrated receiver module can typically comprise 4-8 optical waveguide channels.

In principle, therefore, substantially three types of embodiment of control apparatus are conceivable in respect of the acquisition of the radio-frequency magnetic resonance signals: 1) the control apparatus is expanded with the receiver module on the receiver-module port, 2) the control apparatus comprises the integrated receiver module and 3) the control apparatus comprises the integrated receiver module and is expanded with the receiver module on the receiver-module port. This modularity is in particular advantageous in respect of scaling the control apparatus relative to a number of receive channels of the receiving-coil unit.

The system according to at least one embodiment of the invention comprises the control apparatus and the receiver module, wherein the receiving-coil unit of the magnetic resonance device comprises the receive channel and wherein the receiver module is connected to the motherboard unit by way of the receiver-module port and is embodied to acquire radio-frequency magnetic resonance signals received via the receive channel of the receiving-coil unit of the magnetic resonance device. In other words, the control apparatus is expanded or supplemented by the receiver module on the receiver-module port.

The more receive channels the receiving-coil unit comprises, the more radio-frequency magnetic resonance signals are received and typically have to be processed by the receiver module and/or the integrated receiver module.

However, the number of receive channels varies from embodiment to embodiment of the magnetic resonance device. Therefore, the control apparatus usually requires either the connected receiver module and/or the integrated receiver module. The system has the technical effect that the control apparatus can be easily expanded by the receiver module and simultaneously the receiver module can be controlled by the control apparatus, in particular by the control module. Depending upon the embodiment, this enables a space-saving control apparatus that is nevertheless a modular system.

The receiver-module port connects the receiver module preferably electrically, to the control module and the peripheral module. This connection in particular enables the transmission and exchange of power, the radio-frequency magnetic resonance signals, the control signals and/or the sequence commands.

One embodiment provides that the receiver module comprises an optical waveguide port and an FPGA, wherein the optical waveguide port is embodied to connect the receive channel of the receiving-coil unit of the magnetic resonance device and wherein the FPGA of the receiver module is embodied to filter the radio-frequency magnetic resonance signals. The logical part of the receiver module is mapped in the FPGA and the physical part in particular corresponds to the optical waveguide port. It is conceivable that the receiver module comprises a further printed circuit board, in which, for example, the FPGA is integrated. The further printed circuit board can be connected to the control apparatus via the receiver-module port and/or by wired device(s) and simultaneously connected to the receive channel of the receiving-coil unit.

In principle, when the control apparatus additionally comprises the integrated receiver module, it is conceivable, that the integrated receiver module and the receiver module can acquire or exchange the radio-frequency magnetic resonance signals. For example, the receiver module is only used to acquire the radio-frequency magnetic resonance signals and forwards these to the integrated receiver module for preprocessing and/or filtering.

One embodiment provides that the receiving-coil unit of the magnetic resonance device comprises a further receive channel in addition to the receive channel, wherein the receiver module is embodied to acquire radio-frequency magnetic resonance signals received via the further receive channel of the receiving-coil unit of the magnetic resonance device. In this embodiment, the integrated receiver module and the receiver module can in each case be connected to different receive channels. In principle, it is conceivable that the integrated receiver module is connected to the receive channel and the further receive channel, for example via the optical waveguide and/or a plurality of optical waveguides. In this case, the receiver module can be connectable to a third receive channel and a fourth receive channel and/or additional receive channels. In other words, it is in particular possible that a first number of receive channels can be connected to the integrated receiver module and a second number of receive channels can be connected to the receiver module. For example, the integrated receiver module can be connected to more or fewer receive channels of the receiving-coil unit of the magnetic resonance device compared to the receiver module. Accordingly, the receiver module can increase the capacity of the control apparatus in respect of the receive channels of the receiving-coil unit of the magnetic resonance device. The receiver module can substantially be embodied similarly to the integrated receiver module.

The control system according to at least one embodiment of the invention comprises
an interface,
a personal computer and
the control apparatus,
wherein the personal computer meets softer real-time requirements than the control module and the peripheral module,
wherein the personal computer is embodied to calculate the sequence commands in accordance with the scan sequence and comprises a housing,
wherein the interface is wired and embodied to transmit the sequence commands from the personal computer to the central coordination component and
wherein the control apparatus is connected to the personal computer via the interface and arranged outside the housing of the personal computer.

A limitation of known control systems is typically the very close coupling of the technology of the personal computer with the control apparatus, which hitherto had to be developed and produced separately for each magnetic resonance device. The very close coupling is, for example, necessary due to real-time requirements. For example, hitherto, a control module was plugged directly into the personal computer. On the one hand, the number of slots and in particular space inside the housing of the personal computer for a such a plug-in card is greatly restricted, on the other, the design of the housing places limits on control module connectivity from out of the housing. The slots of the personal computer are usually required for computational accelerators, such as, for example, graphics cards. This very close coupling in particular has the result that, during servicing or within the framework of service contracts, after a certain period of time, all the hardware, i.e. the personal computer together with the respective control module, receiver module and peripheral module, is discarded.

A technical effect of the control system according to at least one embodiment of the invention is in particular to relax the very close coupling by physically separating the personal computer from the control apparatus. The control apparatus is now arranged outside the personal computer and preferably only connected to the personal computer interface with real-time capability. This typically has numerous advantages:
a technical embodiment of the control apparatus is not restricted by spatial specifications for the housing of the personal computer,
the plug-in card ports inside the housing of the personal computer can be used, for example, for the computational accelerators,
the interface is implemented with commercially available standard connections and
the personal computer can preferably correspond to a commercially available, and hence less expensive, variant. Separation enables further cost savings because the respective modules and components can be replaced separately within the framework of the service contract or during servicing. In particular, the technical embodiment of the control apparatus enables individual scalability in accordance with the magnetic resonance device and high synergy effects.

Therefore, the personal computer in particular meets the soft real-time requirements. A defined period of time for the soft real-time requirements is in particular less than 5 ms, preferably less than 1 ms. It is particularly advantageous if the defined period of time is less than 0.5 ms. It is particularly advantageous for the personal computer to meet soft real-time requirements when the sequence commands are transmitted in a continuous flow from the personal computer to the central coordination component via the interface during the imaging examination. This in particular enables time-harmonized transmission.

A further example can include reaction to physiological signals from the patient, which are acquired via the peripheral devices. Comparatively softer real-time requirements can in particular suffice because the personal computer outranks the control module, the peripheral module and, for example, the integrated receiver module and/or the connected receiver module and consequently the longer defined period of time is sufficient. In other words, the control apparatus, in particular the control module, implements tasks that are more time-critical and have higher resolution compared to the personal computer.

The interface is preferably configured such that the sequence commands, which are calculated by the personal computer, are transmitted to the central coordination component. Usually, the interface meets the real-time requirements that are met by the personal computer. For example, a driver, which is used to actuate the interface is embodied in accordance with real-time requirements. In order to meet the meet real-time requirements, it can be necessary for the interface to meet certain physical conditions. Typically, the interface cannot meet real-time requirements over an arbitrary spatial distance, for example, due to losses or latencies during transmission. Therefore, it is, for example, possible for a wired design of the interface to be restricted to a length of about 1 m. The interface is usually embodied for bidirectional data exchange.

Preferably, the personal computer corresponds to a commercially available design, which is usually less expensive than a variant produced specially for the control system. Therefore, usually the personal computer has, on the one hand, standard components and interfaces, for example a USB interface (USB=universal serial bus) according to a USB standard and/or PCIe interface according to the PCIe standard, and, on the other, limited expansion options. In particular, the available space means that only a small number of PCIe interfaces are available. The space is typically defined by the housing. The housing usually encloses the personal computer, comprises a system for cooling the personal computer and provides a certain number of slot brackets, which, for example, are used to expand the personal computer with a PCIe plug-in card. The slot brackets are in particular used to cover a gap in the housing in the proximity of the connections for the plug-in cards. Consequently, the personal computer is restricted with respect to expansion for a variety of reasons, but is in particular inexpensive to procure and simple to configure.

The interface typically comprises a physical port. For example, a mainboard of the personal computer comprises a computing unit, wherein the computing unit is preferably embodied to calculate sequence commands, and the physical port of the interface. In other words, the physical port of the interface is integrated in the mainboard of the personal computer or attached to the mainboard. The mainboard is in particular attached inside the housing. When the physical port is integrated in the mainboard, it is typically embodied according to the PCIe standard. In principle, it is also conceivable for the physical port not to be arranged inside the housing, as in this case, but to be arranged on the housing. Commercially available personal computers comprise, for example, USB ports, which are connected to the mainboard, but can be connected from outside the housing. In this case, the USB port in particular comprises a separate physical port in accordance with the USB standard.

The control apparatus comprises, for example, a further physical port, wherein the further physical port is, for example, attached to the motherboard unit and electrically connected to the control module, the peripheral module and the receiver-module port. For example, the physical port of the interface and the further physical port of the control apparatus can be connected via a cable. The interface preferably comprises the cable. The cable in particular meets the real-time requirements of the personal computer when, for example, the driver has been correspondingly optimized and/or the length of the cable is in particular no longer than 1 m. The cable can be screened against interference fields. The physical port of the interface is in particular extended via the cable and hence also provides an electrical connection between the computing unit and the interface. Advantageously, the cable is embodied in accordance with the same technical standard as the physical port and the interface. Alternatively or additionally, the control module, the integrated receiver module, the peripheral module and/or the receiver module can be connected to the personal computer by way of separate lines, which can be bundled in the cable.

One embodiment provides that the interface is arranged inside the housing. For example, the cable is connected to the physical port of the mainboard. Preferably, the cable can be led out of the housing of the personal computer. In this design, the interface meets the PCIe standard, for example. Advantageously, the cable enables the restriction in respect of the expansion of the personal computer to be relaxed in a cost-efficient and simple manner.

The interface can be embodied to transmit the radio-frequency magnetic resonance signals from the integrated receiver module or the connected receiver module to the personal computer. Typically, the receiver module comprises only a small buffer in the order of a couple of megabytes for short-term storage of the radio-frequency magnetic resonance signals. Usually, the integrated receiver module and/or the connected receiver module transmits the radio-frequency magnetic resonance signals directly to the personal computer.

One embodiment provides that the control system comprises a bulk data interface, wherein the control apparatus is connected to the personal computer via the bulk data interface, wherein the bulk data interface is wired and is embodied to transmit the radio-frequency magnetic resonance signals from the control apparatus to the personal computer and wherein the interface meets harder real-time requirements compared to the bulk data interface. In particular, the radio-frequency magnetic resonance signals are transmitted from the integrated receiver module and/or the connected receiver module via the bulk data interface. In this embodiment, the control system, in particular the personal computer and the control apparatus, comprises the bulk data interface in addition to the interface. In other words, preferably, the control apparatus and the personal computer can be simultaneously connected via the interface and the bulk data interface. In principle, the bulk data and the sequence commands can be transmitted via the interface and the bulk data interface. The bulk data can, for example, comprise the radio-frequency magnetic resonance signals. Usually, the bulk data interface is less expensive and technically simpler compared to the interface. Preferably, the bulk data interface is embodied in accordance with the USB standard and the interface is embodied in accordance with the PCIe standard. When embodied in accordance with the PCIe standard, for technical reasons, the interface is usually more suitable for harder real-time requirements than the bulk data interface when this is embodied in accordance with the USB standard.

One embodiment provides that the personal computer comprises a reconstruction system, which is embodied for the reconstruction of magnetic resonance images in accordance with the radio-frequency magnetic resonance signals. The radio-frequency magnetic resonance signals are preferably transmitted from the integrated receiver module and/or the connected receiver module to the reconstruction system. If the control system comprises the bulk data interface, the radio-frequency magnetic resonance images can preferably be transmitted via the bulk data interface. Usually, the reconstruction system does not meet real-time requirements because the reconstruction of the magnetic resonance images is not normally time-critical. Since, however, usually, the radio-frequency magnetic resonance images cannot be buffered by the control apparatus, the reconstruction system can meet very soft real-time requirements so that the bulk data can in particular be transmitted by the receiver module without congestion and without loss.

One embodiment provides that the control system comprises a further interface in addition to the interface of the control system and a further personal computer in addition to the personal computer of the control system, wherein the further personal computer meets softer real-time requirements than the personal computer and is embodied to define the scan sequence of an imaging examination and to transmit the scan sequence via the further interface to the personal computer. The further interface can, for example, be embodied in accordance with an Ethernet standard. Usually, the further personal computer comprises a display unit and an input unit, wherein the user can define the scan sequence via the input unit. For example, the scan sequence defined is displayed on a graphical user interface of the display unit. Typically, the user can select or define a scan parameter of the scan sequence via the display unit and the input unit. The definition of the scan sequence is usually not time-critical and therefore the further personal computer meets softer real-time requirements than the personal computer. It is conceivable that the real-time requirements of the further personal computer are so soft that the further personal computer does not meet any real-time requirements for the purposes of the imaging examination.

A magnetic resonance system according to at least one embodiment of the invention comprises
the control system and
the magnetic resonance device,
wherein the magnetic resonance device comprises the radio-frequency transmission unit, the gradient-coil unit, the peripheral devices and the receiving-coil unit.

The magnetic resonance system preferably has a high degree of reusability because the control system and in particular the control apparatus are embodied substantially the same across multiple product lines. Preferably, in a comparison of a less expensive with a more expensive magnetic resonance device, the control apparatus is only expanded by way of the receiver module. For example, the number of receive channels directly correlates with the costs of the receiving-coil unit of the magnetic resonance device.

The control system can carry out the imaging examination in accordance with the sequence commands in the magnetic resonance device. The control system is usually arranged in an equipment room, wherein the magnetic resonance device is in particular in the examination room. Typically, the control system is screened, in particular from the main magnetic field of the magnetic resonance device. To control the magnetic resonance device, in particular to actuate the radio-frequency transmission unit and the gradient-coil unit and to acquire the radio-frequency magnetic resonance signals, the respective components and units are preferably connected to corresponding cables, wherein the corresponding cables between the examination room and equipment room are preferably guided through a filter arrangement.

FIG. 1 shows the control apparatus 10 in a first example embodiment. The control apparatus 10 for a magnetic resonance device 11 comprises a control module 12, a peripheral module 13, a receiver-module port 15 and a motherboard unit 16. The control module 12 comprises a central coordination component 12.1, which is embodied to receive sequence commands calculated according to a scan sequence, a radio-frequency-control component 12.2, which is embodied to actuate a radio-frequency transmission unit 11.2 of the magnetic resonance device 11 in accordance with the sequence commands, and a gradient-coil-control component 12.3, which is embodied to actuate a gradient-coil unit 11.3 of the magnetic resonance device 11 in accordance with the sequence commands. The radio-frequency-control component 12.2 is connected to the radio-frequency transmission unit 11.2 and the gradient-coil-control component 12.3 is connected to the gradient-coil unit 11.3.

The peripheral module 13 is embodied to actuate peripheral devices of the magnetic resonance device 11. In this example, the peripheral devices comprise a patient bench 11.L. The peripheral module 13 is connected to the patient bench 11.L. A patient P is arranged on the patient bench 11.L.

The control module 12 and the peripheral module 13 meet real-time requirements. The receiver-module port 15 also has a real-time capability and is embodied for the connection of a receiver module 17, wherein in this example embodiment the receiver module 17 is not connected to the receiver-module port 15 and is therefore not depicted in FIG. 1. When, in an alternative example embodiment, the receiver module 17 is connected, the control module 12, the peripheral module 13 and the receiver module 17 in each case meet real-time requirements because the receiver-module port 15 is also embodied correspondingly.

The control module 12, in particular the central coordination component 12.1, the peripheral module 13 and the receiver-module port 15 are integrated in the motherboard unit 16 and interconnected. The motherboard unit 16 comprises at least one printed circuit board, wherein in another example embodiment a plurality of, in particularly electrically, interconnected printed circuit boards.

Figure 2:
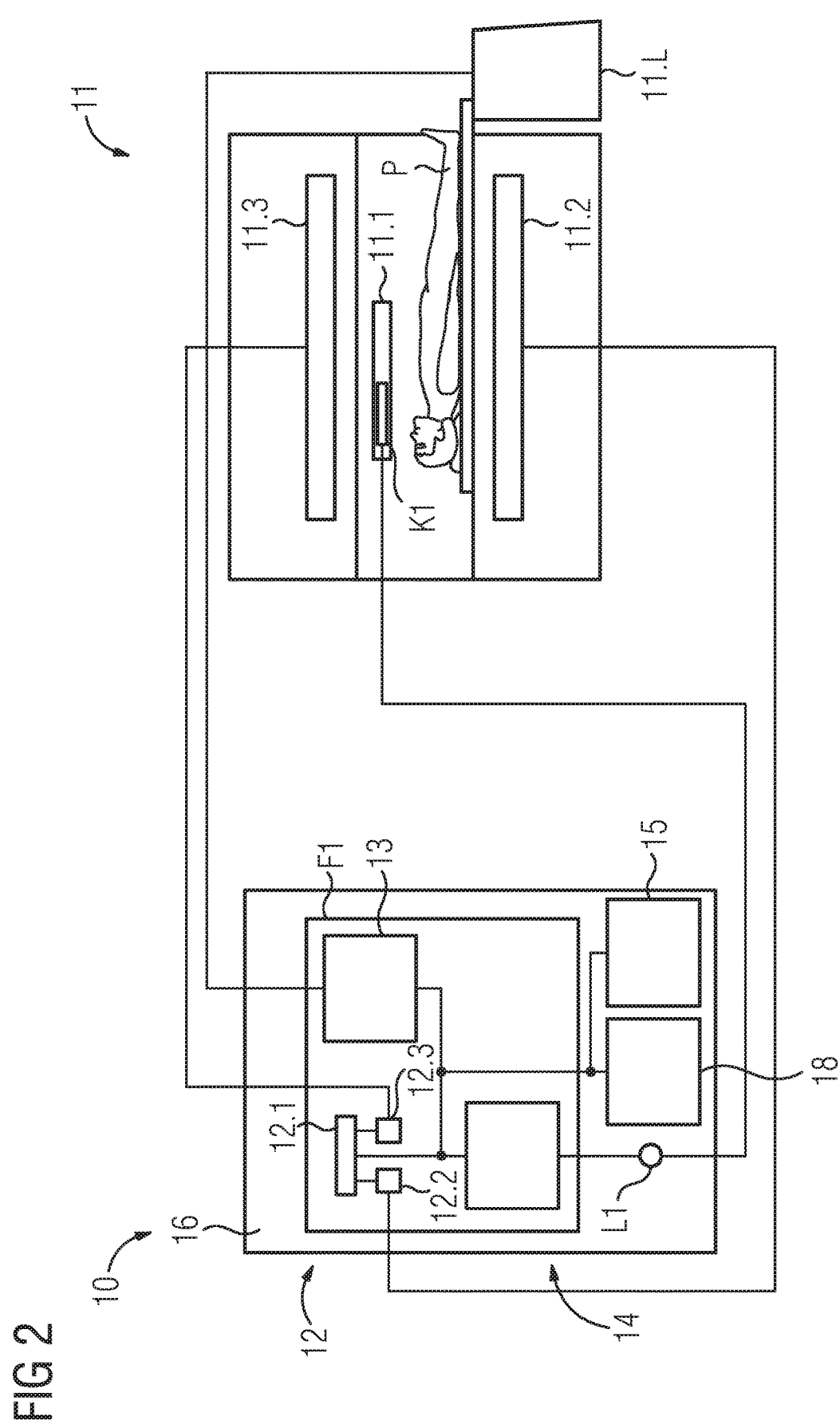
FIG. 2 shows a control apparatus in a second example embodiment

FIG. 2 shows the control apparatus 10 in a second example embodiment. The control apparatus 10 comprises a time-harmonization component 18, wherein the time-harmonization component 18 is integrated in the motherboard unit 16 and embodied to output a timing signal and to harmonize the time of the control module 12, the peripheral module 13 and the receiver-module port 15 by way of the timing signal. The time-harmonization component 18 is connected to the control module 12, in particular the central coordination component 12.1, the peripheral module 13 and the receiver-module port 15.

The control apparatus 10 comprises an FPGA F1, wherein the FPGA F1 is embodied as a single hardware assembly. A logical part of the control module 12 and a logical part of the peripheral module 13 are mapped in the FPGA F1, wherein, alternatively, only the logical part of the control module 12 or the logical part of the peripheral module 13 can be mapped in the FPGA F1. A physical part of the control module 12 and the peripheral module 13 is not shown in FIG. 2. The FPGA F1 is integrated in the motherboard unit 16. The receiver-module port 15 integrated in the motherboard unit 16 outside the FPGA F1 and connected to the FPGA F1 for the transmission of radio-frequency magnetic resonance signals and/or the timing signal.

The control apparatus 10 comprises an integrated receiver module 14. The integrated receiver module 14 is embodied to acquire the radio-frequency magnetic resonance signals received via a receive channel K1 of a receiving-coil unit 11.1 of the magnetic resonance device 11 and is connected to the receiving-coil unit 11.1, in particular to the receive channel K1, via a transmission channel. In this example, the receive channel K1 corresponds to a physical-coil element of the receiving-coil unit 11.1. Typically, the receiving-coil unit 11.1 comprises a plurality of physical-coil elements. The integrated receiver module 14 meets real-time requirements, is integrated in the motherboard unit 16 and connected to the time-harmonization component 18. The integrated receiver module 14 is additionally connected to the central coordination component 12.1, for example for the acquisition of the radio-frequency magnetic resonance signals in accordance with a read-out period.

The integrated receiver module 14, in particular a physical part of the integrated receiver module 14, comprises an optical waveguide port L1, wherein the optical waveguide port L1 is embodied to connect the receive channel K1 of the receiving-coil unit 11.1 of the magnetic resonance device 11 and to transmit the radio-frequency magnetic resonance signals from the integrated receive channel K1 of the receiving-coil unit 11.1 to the integrated receiver module 14. In this example, the receive channel K1 is connected to the optical waveguide port L1, i.e. the physical part of the integrated receiver module 14.

The integrated receiver module 14, in particular a logical part of the integrated receiver module 14, is mapped in the FPGA F1 and the FPGA F1 is embodied to filter the radio-frequency magnetic resonance signals. The physical part of the integrated receiver module 14, in particular the optical waveguide port L1, is not mapped in the FPGA F1, but only electrically connected to the FPGA F1. The optical waveguide port L1 is integrated in the motherboard unit 16.

Figure 3:
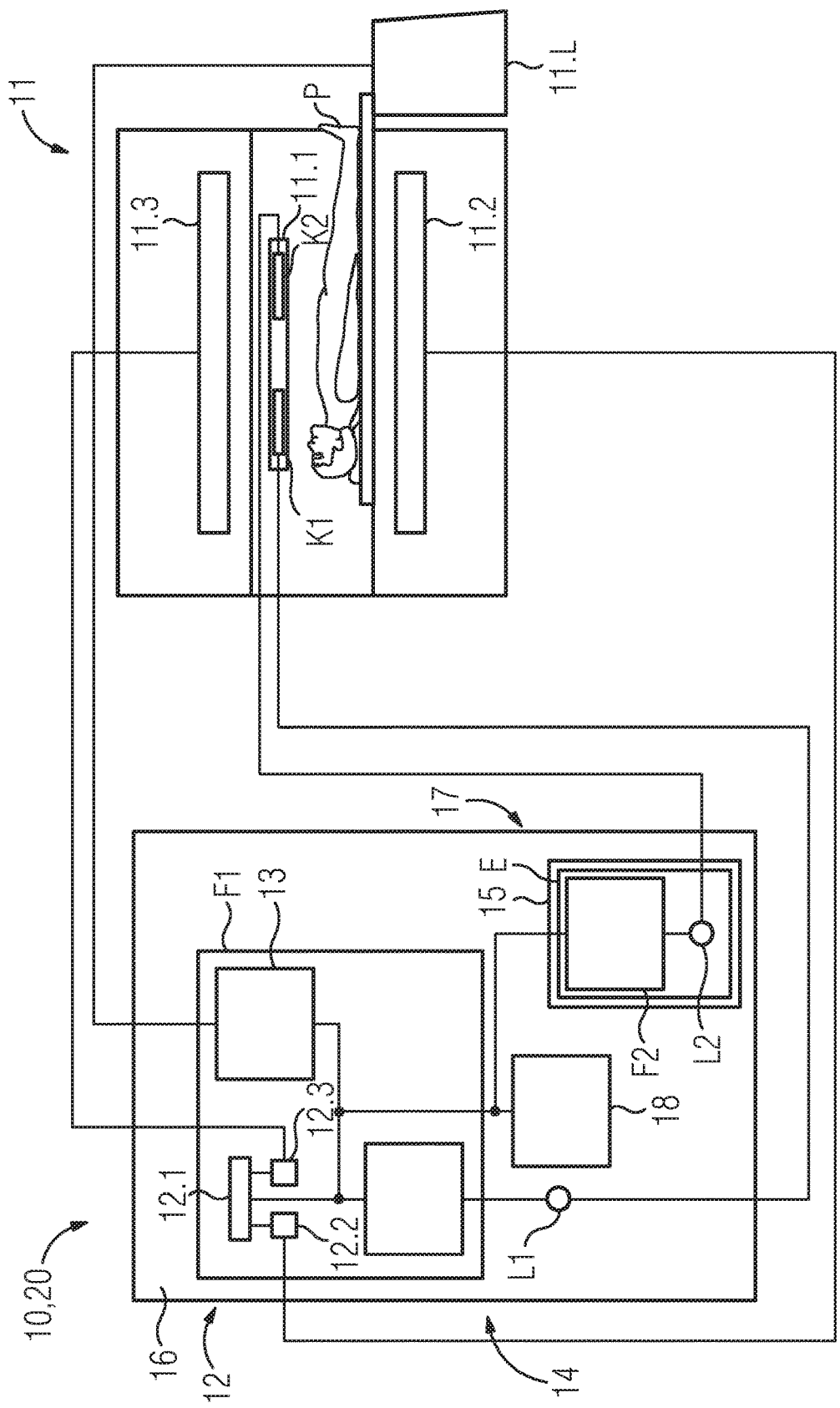
FIG. 3 shows a system.

FIG. 3 shows the system 20. The system 20 comprises the control apparatus 10 and the receiver module 17, wherein the receiving-coil unit 11.1 of the magnetic resonance device 11 comprises a further receive channel K2 in addition to the receive channel K1. In this example, the further receive channel K2 corresponds to a further physical-coil element of the receiving-coil unit 11.1. In this example embodiment, the control apparatus 10 additionally comprises the integrated control module 14.

The receiver module 17 is connected to the motherboard unit 16 via the receiver-module port 15 and embodied to acquire the radio-frequency magnetic resonance signals received via the further receive channel K2 of the receiving-coil unit 11.1 of the magnetic resonance device 11. The receiver module 17 comprises an optical waveguide port L2 and an FPGA F2, wherein the optical waveguide port L2 is embodied to connect the further receive channel K2 of the receiving-coil unit 11.1 of the magnetic resonance device 11 and wherein the FPGA F2 of the receiver module 17 is embodied to filter the radio-frequency magnetic resonance signals. In this example, the receiver module 17 comprises a plug-in card E, wherein the receiver module 17 is connected to the receiver-module port 15 via the plug-in card E. The FPGA F2 is integrated in the plug-in card E, wherein a logic circuit of the receiver module 17 is mapped in the FPGA F2. The logic circuit includes, for example, the filtering and preprocessing of the radio-frequency magnetic resonance signals received via the further receive channel K2. A physical part of the receiver module 17, in particular the optical waveguide port L2, is integrated in the plug-in card E outside the FPGA F2.

In principle, it would be conceivable, that, in addition to the receiver-module port 15, the control apparatus 10 comprises an expansion-receiver-module port and/or an expansion-peripheral-module port. The expansion-receiver-module port preferably enables the connection of an expansion-receiver-module port for further receive channels of the receiving-coil unit 11.1. The expansion-peripheral-module port is, for example, embodied such, that an expansion-peripheral module increases the capacity of the control apparatus 10 or the system 20 in respect of a port of peripheral device of the magnetic resonance devices 11.

The following description is substantially restricted to the differences from the example embodiments in FIG. 1 to FIG. 3, wherein reference is made to the description of the example embodiment in FIG. 1 to FIG. 3 in respect of consistent features. Substantially consistent features are in principle with the given the same reference characters.

Figure 4:
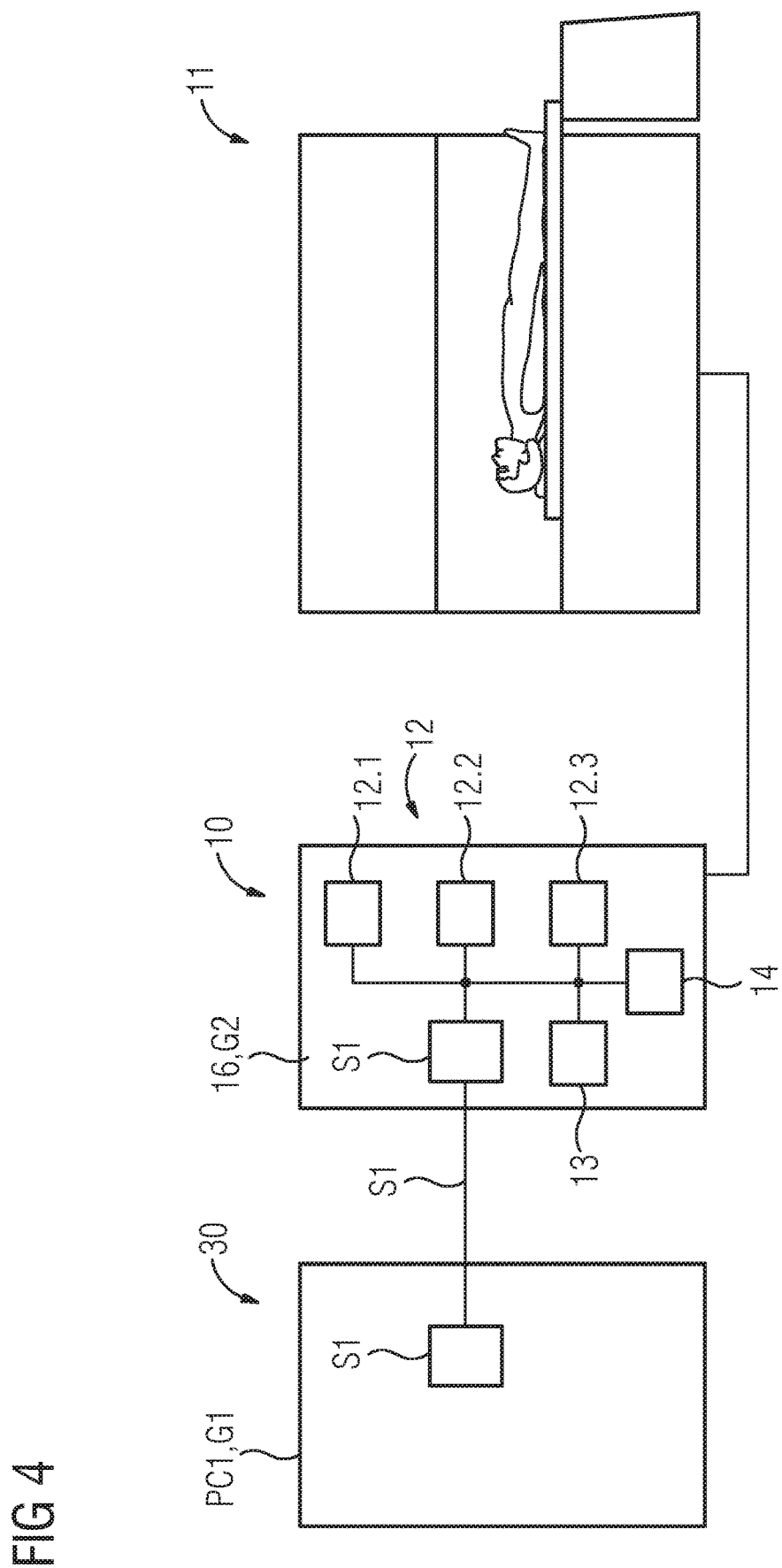
FIG. 4 shows a control system in a first example embodiment.

FIG. 4 shows the control system 30 in a first example embodiment. In this embodiment and in the example embodiments shown in FIG. 5 to FIG. 6, the control apparatus 10 comprises the integrated receiver module 14. Alternatively or additionally, the control apparatus 10 could be expanded via the receiver module on the receiver-module port. For reasons of clarity and due to the substantially identical functions, no differentiation is made between these options in the following.

The control system 30 comprises an interface S1, a personal computer PC1 and the control apparatus 10. The personal computer PC1 meets softer real-time requirements than the control module 12, the peripheral module 13 and the integrated receiver module 14. For example, when the control module 12 meets hard real-time requirements, the personal computer PC1 meets soft real-time requirements. The personal computer PC1 is embodied to calculate the sequence commands in accordance with the scan sequence and comprises a housing G1. The housing G1 corresponds to a commercially available housing of the commercially available personal computer PC1. The interface S1 is wired and embodied to transmit the sequence commands from the personal computer PC1 to the central coordination component 12.1. In addition, the interface S1 is embodied to transmit the radio-frequency magnetic resonance signals from the receiver module 14 to the personal computer PC1.

The control apparatus 10 is connected to the personal computer PC1 via the interface S1 and arranged outside the housing G1 of the personal computer PC1. The control apparatus 10 can, for example, comprise an equipment housing G2, wherein the motherboard unit 16 is installed inside the equipment housing G2. The equipment housing G2 can in particular lie directly on the housing G1 of the personal computer PC1 or alternatively at a slight distance, but nevertheless in close proximity to the personal computer PC1. Preferably, the equipment housing G2 is not subject to the spatial restrictions of the housing G1 of the personal computer PC1. In this case, for example, efficient cooling of the control apparatus 10 is possible.

Figure 5:
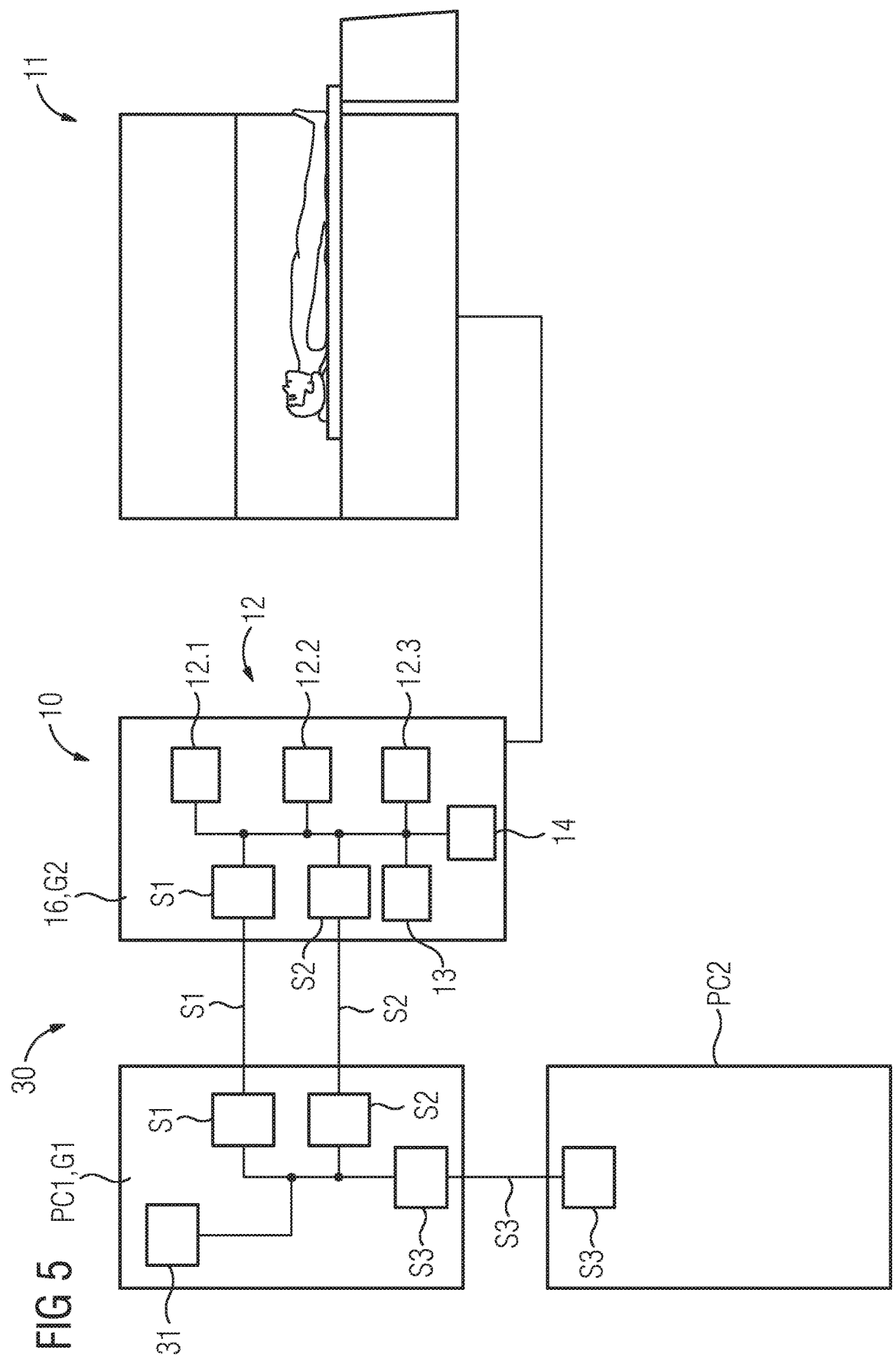
FIG. 5 shows a control system in a second example embodiment.

FIG. 5 shows the control system 30 in a second example embodiment. The personal computer PC1 comprises a reconstruction system 31, which is embodied for the reconstruction of magnetic resonance images in accordance with the radio-frequency magnetic resonance signals. The radio-frequency magnetic resonance signals are preferably transmitted from the control apparatus 10, in particular the integrated receiver module 14, to the reconstruction system 31.

The control system 30 comprises a bulk data interface S2, wherein the control apparatus 10 is connected to the personal computer PC1 via the bulk data interface S2. The control system 30 can comprise further interfaces in addition to the interface S1 and the bulk data interface S2 between the personal computer PC1 and the control apparatus 10. The bulk data interface S2 is wired and embodied to transmit the radio-frequency magnetic resonance signals from the integrated receiver module 14 to the personal computer PC1. Compared to the bulk data interface S2, the interface S1 meets harder real-time requirements. In this example embodiment, preferably, the radio-frequency magnetic resonance signals are transmitted via the bulk data interface S2.

The interface S1 is arranged inside the housing G1. In this case, for example, the interface S1 is embodied as a plug-in card port of a mainboard of the personal computer PC1. Preferably, the plug-in card port is embodied to connect the interface S1, in particular a cable of the interface S1. The cable can, for example, correspond to the PCIe standard and extend the length of the plug-in card port. The length of the plug-in card port of the mainboard is substantially extended out of the housing G1.

In addition to the interface S1 of the control system 30, the control system 30 comprises a further interface S3 and, in addition to the personal computer PC1 of the control system 30, a further personal computer PC2. The further personal computer PC2 meets softer real-time requirements than the personal computer PC1 and is embodied to define the scan sequence of an imaging examination and to transmit the scan sequence via the further interface S3 to the personal computer PC1.

Figure 6:
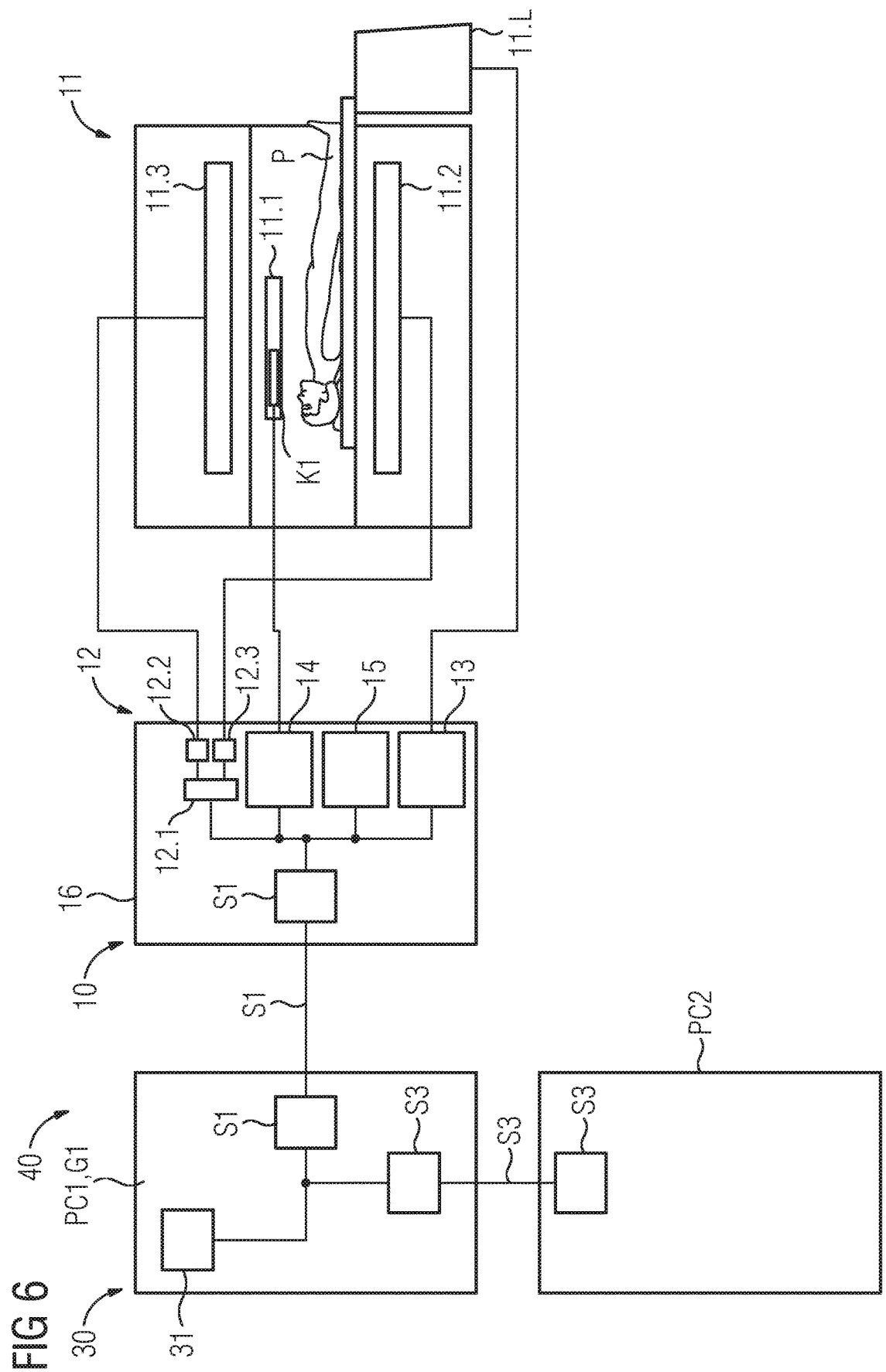
FIG. 6 shows a magnetic resonance system.

FIG. 6 shows the magnetic resonance system 40. The magnetic resonance system 40 comprises the control system 30 and the magnetic resonance device 11, wherein the magnetic resonance device 11 comprises the radio-frequency transmission unit 11.2, the gradient-coil unit 11.3, the peripheral devices and the receiving-coil unit 11.1. The peripheral devices comprise the patient bench 11.L.

The receiving-coil unit 11.1 is arranged in a tunnel-shaped cavity of the magnetic resonance device 11. For example, the receiving-coil unit 11.1 is embodied as a surface coil embodied, which can be placed on the patient P or attached above the patient P. The tunnel-shaped cavity is enclosed by a cover of the magnetic resonance device 11. The radio-frequency transmission unit 11.2 and the gradient-coil unit 11.3 are covered by the cover of the magnetic resonance device 11. A main-magnetic-field unit of the magnetic resonance device 11 is also arranged inside the cover. In this example, the receiving-coil unit 11.1 only comprises the receive channel K1, wherein usually nowadays a plurality of receive channels are installed in a receiving-coil unit.

The user can use the magnetic resonance system 40, for example, to control an imaging examination, in particular a magnetic resonance tomography examination. A common procedure could take the following form: the user defines the scan sequence on a graphical user interface on the further personal computer PC2, which is, for example, arranged in a user room. The scan sequence is transmitted to the personal computer PC1 via the further interface S3. The personal computer PC1 calculates the sequence commands in accordance with the scan sequence and transmits the sequence commands via the interface S1 to the control apparatus 10.

The control module 12, in particular the central coordination component 12.1, receives the sequence commands and coordinates the forwarding of the sequence commands to the radio-frequency-control component 12.2 and the gradient-coil-control component 12.3. The radio-frequency-control component 12.2 actuates controls the radio-frequency transmission unit 11.2 of the magnetic resonance device 11 in accordance with the sequence commands such that that radio-frequency pulses are emitted in the tunnel-shaped cavity of the magnetic resonance device 11. The gradient-coil-control component 12.3 actuates the gradient-coil unit 11.3 of the magnetic resonance device 11 in accordance with the sequence commands such that gradient fields in the tunnel-shaped cavity of the magnetic resonance device 11 superimpose a main magnetic field of the main-magnetic-field unit. Usually, the receiving-coil unit 11.1, in particular the receive channel K1, can receive the radio-frequency magnetic resonance signals and, in this example, transmit them to the integrated receiver module 14.

Following preprocessing and filtering of the radio-frequency magnetic resonance signals, they are transmitted to the personal computer PC1 via the interface S1. Usually, the personal computer PC1 comprises the reconstruction system 31, in order to reconstruct the magnetic resonance images in accordance with the radio-frequency magnetic resonance signals. Preferably, the user is able to inspect the magnetic resonance images on the graphical user interface when the magnetic resonance images have been transmitted to the further personal computer PC2 via the further interface S3.

Although the invention was illustrated and described in more detail by the preferred example embodiments, the invention is not restricted by the disclosed examples and other variations can be derived herefrom by the person skilled in the art without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A control apparatus for a magnetic resonance device, comprising:
a control module configured to
receive sequence commands calculated according to a scan sequence,
actuate a radio-frequency transmission unit of the magnetic resonance device in accordance with the sequence commands, and
actuate a gradient-coil unit of the magnetic resonance device in accordance with the sequence commands;
a peripheral module configured to actuate peripheral devices of the magnetic resonance device, the control module and the peripheral module configured to provide an output within a time period;
a receiver module port configured to connect to a receiver module; and
a motherboard unit, the control module, the peripheral module and the receiver-module port being integrated in the motherboard unit.

2. The control apparatus of claim 1, further comprising: an FPGA, the FPGA being a single hardware assembly, at least one of the control module and the peripheral module being mapped in the FPGA.

3. The control apparatus of claim 1, further comprising: an integrated receiver module, configured to acquire radio-frequency magnetic resonance signals received via a receive channel of a receiving-coil unit of the magnetic resonance device, configured provide an output within the time period, and integrated in the motherboard unit.

4. A control system, comprising:
an interface;
a personal computer including a housing; and
the control apparatus of claim 1,
wherein the personal computer is configured to provide an output within a longer time period than the time period of the control module and the peripheral module,
wherein the personal computer is configured to calculate the sequence commands in accordance with the scan sequence, and
wherein the interface is wired and configured to transmit the sequence commands from the personal computer to a central coordination component, and
wherein the control apparatus is connected to the personal computer via the interface and wherein the control apparatus is arranged outside the housing of the personal computer.

5. The control apparatus of claim 1, wherein the control module is further configured to output a timing signal and configured to harmonize a time of the control module, the peripheral module and the receiver-module port, based on a timing signal.

6. The control apparatus of claim 5, further comprising: an integrated receiver module, configured to acquire radio-frequency magnetic resonance signals received via a receive channel of a receiving-coil unit of the magnetic resonance device, configured provide an output within the time period, and integrated in the motherboard unit.

7. A system, comprising:
the control apparatus of claim 5; and
the receiver module, wherein a receiving-coil unit of the magnetic resonance device comprises a receive channel and
wherein the receiver module is connected to the motherboard unit via the receiver-module port and wherein the receiver module is configured to acquire radio-frequency magnetic resonance signals received via the receive channel of the receiving-coil unit of the magnetic resonance device.

8. The control apparatus of claim 5, further comprising: a Field Programmable Gate Array (FPGA), the FPGA being a single hardware assembly, wherein at least one of the control module and the peripheral module is mapped in the FPGA.

9. The control apparatus of claim 8, further comprising: an integrated receiver module configured to acquire radio-frequency magnetic resonance signals received via a receive channel of a receiving-coil unit of the magnetic resonance device, the integrated receiver module being configured to provide an output within the time period, and integrated in the motherboard unit.

10. The control apparatus of claim 9, wherein the integrated receiver module includes an optical waveguide port, the optical waveguide port being configured to connect the receive channel of the receiving-coil unit of the magnetic resonance device and configured to transmit the radio-frequency magnetic resonance signals from the receive channel of the receiving-coil unit to the integrated receiver module.

11. The control apparatus of claim 9, wherein the integrated receiver module is mapped in the FPGA and the FPGA is configured to filter the radio-frequency magnetic resonance signals.

12. The control apparatus of claim 11, wherein the integrated receiver module includes an optical waveguide port, the optical waveguide port being configured to connect the receive channel of the receiving-coil unit of the magnetic resonance device and configured to transmit the radio-frequency magnetic resonance signals from the receive channel of the receiving-coil unit to the integrated receiver module.

13. A control system, comprising:
an interface;
a personal computer including a housing; and
the control apparatus of claim 9,
wherein the personal computer is configured to provide an output within a longer time period than the time period of the control module and the peripheral module,
wherein the personal computer is configured to calculate the sequence commands in accordance with the scan sequence, and
wherein the interface is wired and configured to transmit the sequence commands from the personal computer to a central coordination component, and
wherein the control apparatus is connected to the personal computer via the interface and wherein the control apparatus is arranged outside the housing of the personal computer.

14. The control system of claim 13, wherein the interface is arranged inside the housing.

15. A magnetic resonance system, comprising:
the control system of claim 13; and
the magnetic resonance device, the magnetic resonance device including the radio-frequency transmission unit, the gradient-coil unit, the peripheral devices and the receiving-coil unit.

16. The control system of claim 13, further comprising:
a bulk data interface, the control apparatus being connected to the personal computer via the bulk data interface, wherein the bulk data interface is wired and is configured to transmit the radio-frequency magnetic resonance signals from the control apparatus to the personal computer and wherein the interface is configured to provide an output in a shorter time period than the time period of the bulk data interface.

17. The control system of claim 16, wherein the personal computer comprises a reconstruction system, configured to reconstruct of magnetic resonance images in accordance with the radio-frequency magnetic resonance signals.

18. The control system of claim 13, wherein the personal computer comprises a reconstruction system, configured to reconstruct magnetic resonance images in accordance with the radio-frequency magnetic resonance signals.

19. The control system of claim 18, further comprising:
a further interface; and
a further personal computer, the further personal computer configured to provide an output within a longer time period than the time period of the personal computer and the further personal computer being configured to define the scan sequence of an imaging examination and being configured to transmit the scan sequence to the personal computer via the further interface.

20. A magnetic resonance system, comprising:
the control system of claim 18; and
the magnetic resonance device, the magnetic resonance device including the radio-frequency transmission unit, the gradient-coil unit, the peripheral devices and the receiving-coil unit.

21. The control system of claim 13, further comprising:
a further interface; and
a further personal computer, the further personal computer being configured to provide an output within a longer time period than the time period of the personal computer and the further personal computer being configured to define the scan sequence of an imaging examination and being configured to transmit the scan sequence to the personal computer via the further interface.

22. A magnetic resonance system, comprising:
the control system of claim 21; and
the magnetic resonance device, the magnetic resonance device including the radio-frequency transmission unit, the gradient-coil unit, the peripheral devices and the receiving-coil unit.

23. A system, comprising:
the control apparatus of claim 1; and
the receiver module, wherein a receiving-coil unit of the magnetic resonance device comprises a receive channel and
wherein the receiver module is connected to the motherboard unit via the receiver-module port and wherein the receiver module is configured to acquire radio-frequency magnetic resonance signals received via the receive channel of the receiving-coil unit of the magnetic resonance device.

24. The system of claim 23, wherein the receiver module comprises an optical waveguide port and an FPGA, wherein the optical waveguide port is configured to connect the receive channel of the receiving-coil unit of the magnetic resonance device and wherein the FPGA of the receiver module is configured to filter the radio-frequency magnetic resonance signals.

25. The system of claim 23, wherein the receiver module is an integrated receiver module, the integrated receiver module being configured to acquire the radio-frequency magnetic resonance signals received via the receive channel of the receiving-coil unit of the magnetic resonance device, the integrated receiver module being configured provide an output within the time period, and integrated in the motherboard unit, and
wherein the receiving-coil unit of the magnetic resonance device further includes a further receive channel, wherein the receiver module is configured to acquire radio-frequency magnetic resonance signals received via the further receive channel of the receiving-coil unit of the magnetic resonance device.

* * * * *

UNITED STATES PATENT AND TRADEMARK OFFICE
CERTIFICATE OF CORRECTION

PATENT NO. : 10,852,377 B2
APPLICATION NO. : 16/131083
DATED : December 1, 2020
INVENTOR(S) : Swen Campagna It is certified that error appears in the above-identified patent and that said Letters Patent is hereby corrected as shown below:

On the Title Page

Item (30), please add:
--(30) Foreign Application Priority Data:
September 19, 2017 (EP) 17191928.5--

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*